United States Patent
Hong et al.

(10) Patent No.: US 11,764,415 B2
(45) Date of Patent: *Sep. 19, 2023

(54) METHOD AND DEVICE FOR CHARGING BATTERY

(71) Applicant: SAMSUNG ELECTRONICS CO., LTD., Suwon-si (KR)

(72) Inventors: Jin Seok Hong, Seoul (KR); Jeong Kuk Shon, Hwaseong-si (KR); Young-Gyoon Ryu, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 107 days.

This patent is subject to a terminal disclaimer.

(21) Appl. No.: 17/135,144

(22) Filed: Dec. 28, 2020

(65) Prior Publication Data

US 2021/0135479 A1 May 6, 2021

Related U.S. Application Data

(63) Continuation of application No. 15/879,883, filed on Jan. 25, 2018, now Pat. No. 10,879,718.

(30) Foreign Application Priority Data

Feb. 7, 2017 (KR) .......................... 10-2017-0016870

(51) Int. Cl.
*H01M 10/44* (2006.01)
*H01M 10/48* (2006.01)
(Continued)

(52) U.S. Cl.
CPC .......... *H01M 10/44* (2013.01); *G01R 31/388* (2019.01); *H01M 10/48* (2013.01); *H02J 7/0071* (2020.01);
(Continued)

(58) Field of Classification Search
CPC .................. H02J 7/0047; H02J 7/0072; G01R 31/36–396

See application file for complete search history.

(56) References Cited

U.S. PATENT DOCUMENTS 8,310,208 B2  11/2012  Sengupta
8,502,494 B2  8/2013  Nieh et al.
(Continued)

FOREIGN PATENT DOCUMENTS

EP  3287801 A1  2/2018
JP  2012225713  11/2012
(Continued)

OTHER PUBLICATIONS

European Office Action for European Patent Application No. 18154891.8 dated Apr. 1, 2019.
(Continued)

*Primary Examiner* — David V Henze-Gongola
(74) *Attorney, Agent, or Firm* — CANTOR COLBURN LLP

(57) ABSTRACT

A method for charging a battery includes: determining a first charging section, in which a current charging rate of the battery is located, from among a plurality of charging sections predetermined based on a functional relation between a state of charge of the battery and an open circuit voltage of an anode of the battery; and charging the battery for the first charging section with a first charging rate corresponding to the first charging section.

16 Claims, 16 Drawing Sheets

(51) Int. Cl.
*H02J 7/00* (2006.01)
*G01R 31/388* (2019.01)

(52) U.S. Cl.
CPC .... *H02J 7/00714* (2020.01); *H02J 7/007184* (2020.01); *H02J 7/0048* (2020.01)

(56) References Cited

U.S. PATENT DOCUMENTS

| | | |
|---|---|---|
| 8,653,794 B2 | 2/2014 | Joe et al. |
| 8,742,727 B2 | 6/2014 | Joe et al. |
| 8,901,892 B2 | 12/2014 | Yazami et al. |
| 9,046,583 B2 | 6/2015 | Joe et al. |
| 9,065,292 B2 | 6/2015 | Yazami |
| 9,130,248 B2 | 9/2015 | Laskowsky et al. |
| 9,207,287 B2 | 12/2015 | Joe et al. |
| 9,276,293 B2 | 3/2016 | Xu |
| 10,236,702 B2 | 3/2019 | Ha et al. |
| 10,879,718 B2 * | 12/2020 | Hong .................. H02J 7/0071 |
| 2001/0006338 A1 | 7/2001 | Yamashita |
| 2011/0037438 A1 * | 2/2011 | Bhardwaj ............ H02J 7/0071 320/152 |
| 2011/0037439 A1 * | 2/2011 | Bhardwaj ........ H01M 10/0525 320/152 |
| 2012/0293131 A1 | 11/2012 | Nakamura et al. |
| 2014/0253023 A1 | 9/2014 | Paryani et al. |
| 2014/0266068 A1 | 9/2014 | O'Brien et al. |
| 2014/0375279 A1 | 12/2014 | Nishino et al. |
| 2015/0130417 A1 | 5/2015 | Song et al. |
| 2015/0147614 A1 | 5/2015 | Wang et al. |
| 2016/0103185 A1 | 4/2016 | Chang et al. |
| 2018/0292461 A1 | 10/2018 | Kim et al. |
| 2020/0049774 A1 | 2/2020 | Gao et al. |

FOREIGN PATENT DOCUMENTS

| | | |
|---|---|---|
| JP | 2013057537 | 3/2013 |
| JP | 2017533691 A | 11/2017 |
| KR | 1454828 B1 | 10/2014 |
| WO | 2013046690 A1 | 4/2013 |
| WO | 2015077669 | 5/2015 |

OTHER PUBLICATIONS

Extended European Search Report—European Patent Application No. 18154891.8 dated Jun. 8, 2018, citing references listed within.
Weixiang Shen et al., Charging Algorithms of Lithium-Ion Batteries:an Overview, 2011, pp. 1567-1572, 2012 7th IEEE Conference on Industrial Electronics and Applications (ICIEA).
Yi-Hwa Liu et al., Search for an Optimal Rapid Charging Pattern forLithium-Ion Batteries Using Ant ColonySystem Algorithm, 2005, pp. 1328-1336, vol. 52, No. 5, IEEE Transactions on Industrial Electronics.
Japanese Office Action for Application No. 2018-013742 dated Jul. 13, 2021.
Chinese Office Action dated Mar. 6, 2023, issued in corresponding Chinese Patent Application No. 201810121334.2 cited references listed within (with translation).

* cited by examiner

METHOD AND DEVICE FOR CHARGING BATTERY

CROSS-REFERENCE TO RELATED APPLICATION

This application is a continuation of U.S. patent application Ser. No. 15/879,883, filed on Jan. 25, 2018, which claims priority to Korean Patent Application No. 10-2017-0016870, filed on Feb. 7, 2017, and all the benefits accruing therefrom under 35 U.S.C. § 119, the content of which in its entirety is herein incorporated by reference.

BACKGROUND

1. Field

The disclosure relates to a method and device for charging a battery by changing a charging rate with multiple stages.

2. Description of the Related Art

Various types of charging algorithms for improving a charging speed of a battery have been suggested. In general, a constant current-constant voltage ("CC-CV") charging scheme is varied, or a method that is similar to the CC-CV charging scheme is combined, and there are algorithms such as a pulse charging, a boost charging, and a multi-stage constant current charging.

The pulse charging scheme represents a method for applying a high current to the battery for a predetermined time, and providing a pause period (or a discharge time). According to the pulse charging scheme, a concentration of lithium ions on a surface of an active material is increased through a high-level current applied in an initial charging stage thereby acquiring a maximum spread speed, and a concentration distribution of lithium ions are relaxed through a discharging (or a relaxation) thereby controlling an additional side reaction. In a pulse charging scheme, the pulse charging scheme includes a section during which no actual charging is performed (a pause or discharge section) represented by a duty cycle, so there is a limit in improvements of charging speed.

The boost charging scheme applies a high current in an earlier stage to generate a high voltage, and charges with a constant voltage for a predetermined time, and then performs a CC-CV charging. According to the boost charging scheme, the completely discharged battery has high high-rate adaptation performance in the earlier stage of charging, so a constant voltage charging is performed up to the 30% of charging rate, and a voltage that is higher than a voltage at a constant voltage section in a latter portion to perform a charging with a high current. The boost charging scheme uses an initial battery state, in which the battery is very close to a complete discharging in consideration of the high current applying stage, in the earlier charging stage.

In such a conventional charging schemes, an algorithm that uses an initially input charging condition to check the discharge characteristics and adjust the initial input charging condition based on trial and error, or states (temperature, temperature change, voltage, or voltage change) of the battery according to the applied current are measured and the value of the current is desired to be controlled, so risks of time and experiments for confirmation of the algorithm increase, and an additional system for an adaptive-scheme controlling is used, thereby increasing complexity of application.

SUMMARY

A multi-stage constant current scheme divides the time axis into a plurality of sections, and applies currents from a higher current to a lower current as the respective sections are in progress. Division of respective sections follows a predetermined threshold voltage, and when the charging voltage reaches the threshold voltage, the size of the current is changed (i.e., a lower current is applied). The sizes of currents for respective sections are determined by various optimization tools, and in general, an optimized pattern is determined by repeating the process for checking discharge characteristics after a first application of a profile. By dividing the respective stages by a voltage and changes of current intensity, various types of algorithms may be deduced. The key aspect of the multi-stage constant current scheme is to set a section for maintaining capacity of the battery while maximizing the charging speed, and determine charging rate intensities for respective sections.

Exemplary embodiments of the invention are directed to a method for charging a battery using a multi-stage constant current scheme.

Exemplary embodiments of the invention are directed to a device for charging a battery by use of a multi-stage constant current scheme.

An exemplary embodiment of the invention provides a method for charging a battery including: determining a first charging section, in which a current charging rate of the battery is located, from among a plurality of charging sections predetermined based on a functional relation between a state of charge ("SOC") of the battery and an open circuit voltage ("OCV") of an anode of the battery; and charging the battery for the first charging section with a first charging rate corresponding to the first charging section.

In an exemplary embodiment, the battery charging method may further include charging the battery for a second charging section, which is next to the first charging section from among the plurality of charging sections, with a second charging rate corresponding to the second charging section when the first charging section ends.

In an exemplary embodiment, the battery charging method may further include monitoring whether a charging voltage of the battery has reached a predetermined voltage value when the first charging section is the last charging section from among the plurality of charging sections or a second charging section, which is next to the first charging section from among the plurality of charging sections, is the last charging section; and applying a maximum charging voltage to the battery when the charging voltage reaches the predetermined voltage value.

In an exemplary embodiment, the plurality of charging sections may be determined based on a window with a predetermined height applied with reference to a minimum or a maximum of a differential graph of the functional relation included in the charging sections, and the predetermined height may be predetermined according to complexity of a charging processor.

In an exemplary embodiment, the predetermined height may be predetermined as a value equal to or less than 0.6.

In an exemplary embodiment, as the predetermined height increases, a width of the window may increase to increase respective lengths of the charging sections, and as the predetermined height decreases, the width of the window may reduce to reduce the respective lengths of the charging sections.

In an exemplary embodiment, as the predetermined height increases, a width of the window may increase to reduce a number of the charging sections, and as the predetermined height decreases, the width of the window may reduce to increase the number of the charging sections.

In an exemplary embodiment, the first charging rate may be maintained at a constant value for the first charging section, and a difference between a potential of an anode of the battery and a potential of an electrolyte solution of the battery may be determined to be less than a predetermined value at an ending point of the first charging section.

In an exemplary embodiment, the predetermined value may be $2 \times 10^{-6}$ volt (V).

In an exemplary embodiment, the first charging rate may be maintained at a constant value for the first charging section, and a difference between a potential of an anode of the battery and a potential of an electrolyte solution of the battery may be determined to be greater than zero (0) for the first charging section.

In an exemplary embodiment, a value of the first charging rate may be greater than a value of the second charging rate.

Another other embodiment of the invention provides a device for charging a battery including: a processor, a memory connected to the processor, and a charging interface connected to the battery, where the processor performs a program stored in the memory to perform: determining a first charging section, in which a current charging rate of the battery is located, from among a plurality of charging sections predetermined based on a functional relation between an SOC of the battery and an OCV of an anode of the battery; and charging the battery for the first charging section with a first charging rate corresponding to the first charging section.

In an exemplary embodiment, the processor may perform the program stored in the memory to further perform charging the battery for a second charging section, which is next to the first charging section from among the plurality of charging sections, with a second charging rate corresponding to a second charging section when the first charging section is finished.

In an exemplary embodiment, the processor may perform the program stored in the memory to further perform: monitoring whether a charging voltage of the battery has reached a predetermined voltage value when the first charging section is the last charging section from among the plurality of charging sections or a second charging section, which is next to the first charging section from among the plurality of charging sections, is the last charging section; and applying a maximum charging voltage to the battery when the charging voltage reaches the predetermined voltage value.

In an exemplary embodiment, the charging sections may be determined based on a window with a predetermined height applied with reference to a minimum or a maximum of a differential graph of the functional relation included in the charging sections, and the predetermined height may be predetermined according to complexity of a charging processor.

In an exemplary embodiment, the predetermined height may be predetermined as a value equal to or less than 0.6.

In an exemplary embodiment, as the predetermined height increases, a width of the window may increase to increase respective lengths of the charging sections, and as the predetermined height decreases, the width of the window may reduce to reduce the respective lengths of the charging sections.

In an exemplary embodiment, as the predetermined height increases, a width of the window may increase to reduce a number of the charging sections, and as the predetermined height decreases, the width of the window may reduce to increase the number of the charging sections.

In an exemplary embodiment, the first charging rate may be maintained at a constant value for the first charging section, and a difference between a potential of an anode of the battery and a potential of an electrolyte solution of the battery may be determined to be less than a predetermined value at an ending point of the first charging section.

In an exemplary embodiment, the predetermined value may be about $2 \times 10^{-6}$ V.

In an exemplary embodiment, the first charging rate may be maintained at a constant value for the first charging section, and a difference between a potential of an anode of the battery and a potential of an electrolyte solution of the battery may be determined to be greater than zero (0) for the first charging section.

In an exemplary embodiment, a value of the first charging rate may be greater than a value of the second charging rate.

According to the exemplary embodiments of the invention, the lithium plating phenomenon of the battery may be effectively prevented from occurring by charging the battery based on the charging section and the charging rate corresponding to the charging section, which are determined based on the change of the OCV of the anode material of the battery.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1:
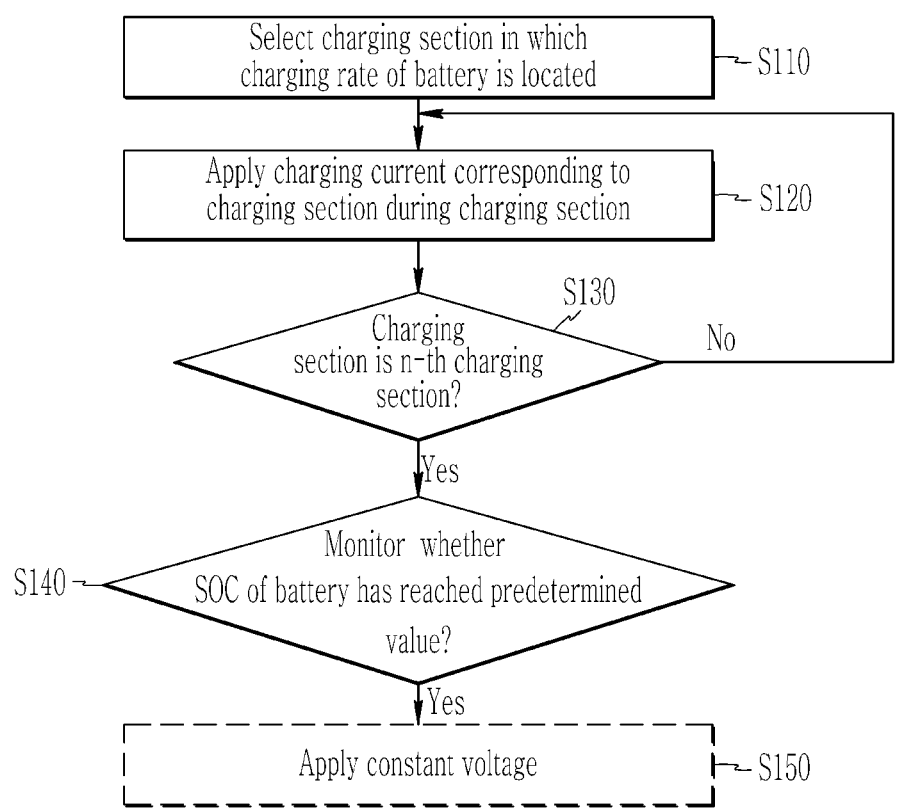
FIG. 1 shows a flowchart of a battery charging method according to an exemplary embodiment.

The invention will be described more fully hereinafter with reference to the accompanying drawings, in which exemplary embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Hereinafter, exemplary embodiments of the invention will be described in detail with reference to the accompanying drawings.

FIG. 1 shows a flowchart of a battery charging method according to an exemplary embodiment.

In an exemplary embodiment, the battery is charged based on the multi-stage constant current charging scheme. Referring to FIG. 1, in an exemplary embodiment, a battery charging device checks a charged amount (a state of charge or a charging voltage) of the battery, and selects a charging section corresponding to a residual charged amount (S110).

According to an exemplary embodiment, a plurality of charging sections for charging a battery are determined based upon a relationship between a state of charge ("SOC") and an open circuit voltage ("OCV") of an anode material of the battery. The charging section according to an exemplary embodiment will now be described in detail with reference to FIG. 2 and FIG. 3.

Figure 2:
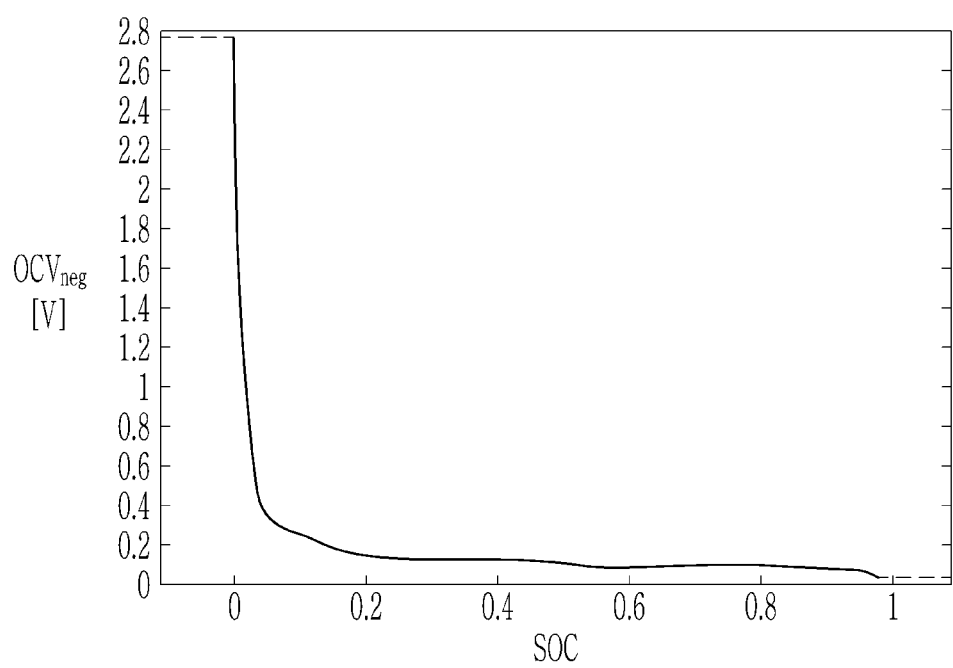
FIG. 2 shows a graph of a relationship between a state of charge ("SOC") of a battery and an open circuit voltage ("OCV") of an anode according to an exemplary embodiment.
Figure 3:
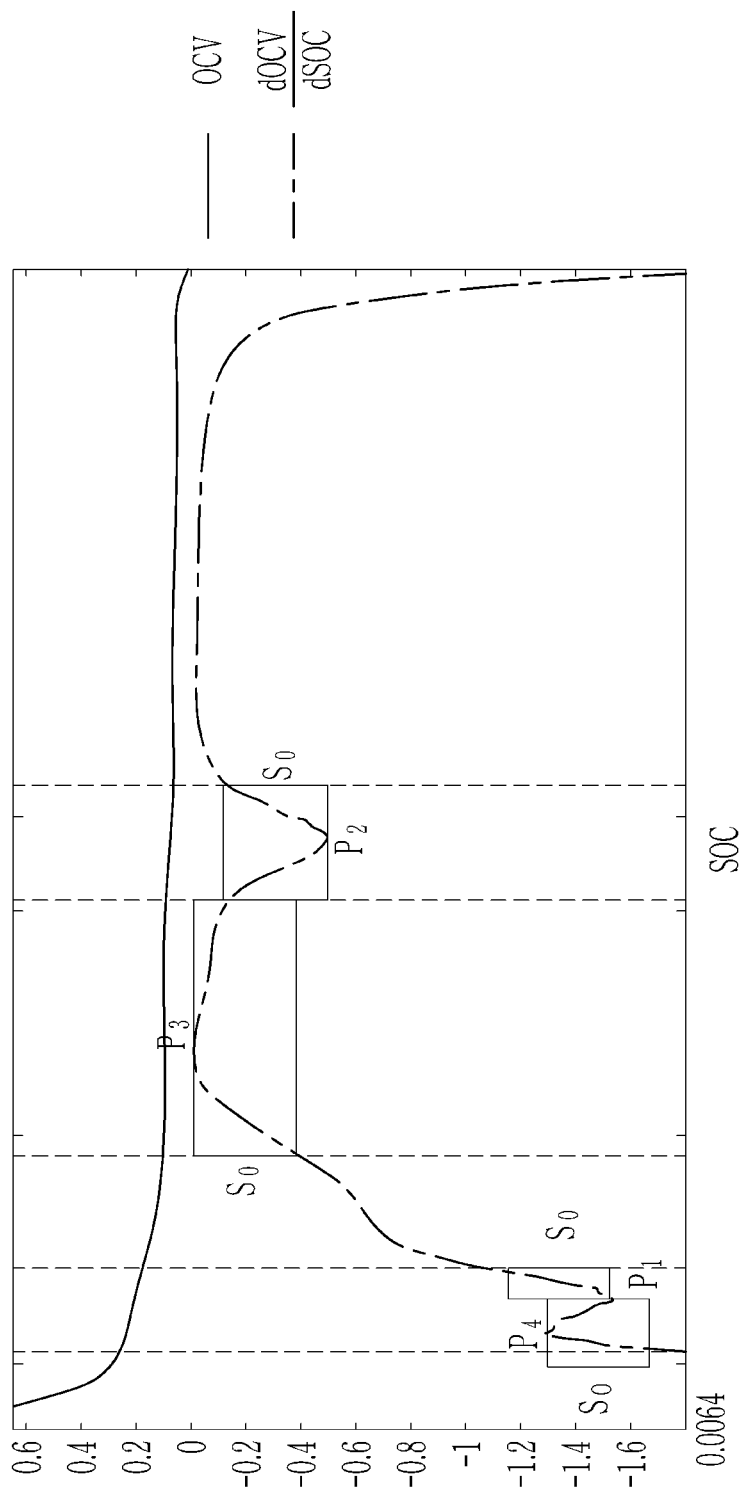
FIG. 3 shows a charging section determined by a relationship between an SOC of a battery and an OCV of an anode according to an exemplary embodiment.

FIG. 2 shows a graph of a relationship between an SOC of a battery and an OCV of an anode according to an exemplary embodiment, and FIG. 3 shows a functional relation between an SOC of a battery and an OCV of an anode, and a charging section determined by the functional relation.

In FIG. 2, the x-axis indicates an SOC of the battery, and the y-axis represents an OCV of an anode of the battery. The SOC of the battery is determined by a ratio of Li in the anode. Referring to FIG. 2, the OCV of the anode decreases as the SOC increases. In such an embodiment, when the charging is performed, a potential (phis) of an anode active material (a solid matter) decreases, and on the contrary, a potential (phil) of an electrolyte (a liquid) increases because of supplying of lithium positive ions. In such an embodiment, when the potential of the anode active material becomes equal to the potential of the electrolyte (phis=phil), lithium positive ions may be deposited. Therefore, a lithium-plating (Li-plating) phenomenon may be effectively prevented by analyzing a change of reduction of the OCV caused by a Li concentration in the anode active material. The lithium plating phenomenon represents a phenomenon that lithium positive ions (Li+) supplied to the anode are not quickly absorbed at the anode, but are accumulated and thereby deposited as a lithium metal, which is one of the most undesired aspect that have to be considered when the battery is charged by applying a high charging rate (i.e., a high current rate (high charging rate)). When the lithium plating phenomenon occurs, non-uniform lithium dendrites (Li-dendrite) may be formed, the battery may become shorted. Accordingly, the life-span of the battery may be reduced, and the battery may be exploded. The lithium plating phenomenon occurs when the battery is charged and a difference between the potential of the anode active material and the potential of the electrolyte is close to zero (0). Therefore, the lithium plating may be estimated by the change of potential of the anode according to the concentration of lithium in the anode active material.

According to an exemplary embodiment, a plurality of charging sections for charging the battery may be determined or distinguished depending on a point at which a pattern of an OCV reduction (e.g., a slope of an SOC-OCV graph or a dOCV/dSOC graph) of the anode changes. In one exemplary embodiment, for example, the charging section may be determined or distinguished with reference to the point where a slope of the OCV of the anode is analyzed with respect to the SOC (or time), and a difference of slopes becomes a predetermined value.

According to an exemplary embodiment, a peak point is determined based on a differential graph (shown by a single dash-dot line) having differentiated a functional relation of the OCV with respect to the SOC. When there is a minimum (a point at which the differential value changes from a negative value to a positive value) in the differential graph, the charging section is determined based on the minimum as a reference. Referring to FIG. 3, a point $P_1$ and a point $P_2$ on the differential graph correspond to the minimums. A window (a window in the (+) direction) with a height of $S_0$ is applied with reference to the respective minimums.

According to an exemplary embodiment, the window has a predetermined height $S_0$, and a width of the window is determined by a point where one of an upper side and a lower side of the window meets the differential graph. The height $S_0$ of the window is a predetermined value, e.g., a value that is not greater than 0.6 according to a complexity of a charging process. In one exemplary embodiment, for example, when the height $S_0$ is determined to be high, a width of the window increases to increase a length of the charging section and reduce a number of charging sections included in the charging process. When the height $S_0$ is determined to be low, the width of the window reduces to reduce the length of the charging section and increase the number of charging sections included in the charging process. Therefore, in a case where the charging process is desired to be simply controlled, the height $S_0$ of the window is predetermined as a relatively greater value. In another case, where the charging process is desired to be precisely controlled, the height $S_0$ of the window is predetermined as a relatively less value.

Referring to FIG. 3, when the window with the height $S_0$ is applied to the point $P_1$, a right border of the second charging section is determined, and when the window with the height $S_0$ is applied to the point $P_2$, respective borders of the fifth charging section are determined. A left border of the point $P_1$ may be determined by a maximum (a point at which the differential value changes from a positive value to a negative value) since the maximum exists in the window applied to the point $P_1$.

The window with the height $S_0$ is applied with reference to the maximum. Referring to FIG. 3, points $P_3$ and $P_4$ on the differential graph correspond to the maximum. The window (a window in a (−) direction) with the height $S_0$ is applied with respect to a y-axis value of the maximum. Accordingly, a left border of the second charging section and a left border of the fourth charging section are determined. In FIG. 3, the right border of the first charging section is equal to the left border of the predetermined second charging section, and the respective borders of the third charging section are equal to the right border of the predetermined second charging section and the left border of the fourth charging section. That is, according to an exemplary embodiment, a border of the charging section (the third charging section) that monotonically increases or monotonically decreases may be determined by a border of another charging section. In such an embodiment, in the section (the sixth charging section) with a small variation of the OCV, the charging sections may not be divided although there exists a minimum or a maximum. In such an embodiment, the last charging section (e.g., the sixth charging section) of the charging sections is a constant voltage section, and the last charging section may be determined according to another reference.

In such an embodiment, when the minimum and the maximum are within a predetermined range (i.e., when gaps of the minimum and the maximum is smaller than a predetermined value), it may be omitted to determine the border by the maximum. In one exemplary embodiment, for example, in FIG. 3, when the minimum $P_1$ and the maximum $P_4$ are included in a predetermined range, respective borders of the second charging section may be determined by the window (a window in the (+) direction) with the height $S_0$ with respect to the minimum $P_1$, or the right border of the second charging section may be determined by the window (a window in the (+) direction) with the y-axis value that is greater than the minimum $P_1$ by $S_0$, and the left border of the second charging section may be determined by the window (a window in the (−) direction) with the y-axis value that is less than the minimum $P_1$ by $S_0$.

According to an exemplary embodiment, when the height $S_0$ indicating the difference between the slope corresponding to the border and the slope of one of the minimum and the maximum is set to be a relatively big value (e.g., 0.3), a section length of respective charging sections becomes longer and the number of charging sections reduces so the charging process may be simplified. Alternatively, when the height $S_0$ is set to be a relatively small value (e.g., 0.05), the section length of respective charging sections becomes shorter and the number of charging section increases so the battery may be further precisely charged. In one exemplary embodiment, $S_0$ indicating the height of the window for determining a charging section may be determined to be less than a predetermined value (e.g., 0.5).

Referring to FIG. 3, the slope of the SOC-OCV graph in each section is maintained to be relatively constant (a changing rate of the slope in the section ≈0) or at a substantially constant value, but average slopes of respective sections have different values. That is, the changing rate of the slope of the border of each section has a relatively big value than the changing rate of the slope in each section (the changing rate of the slope of the border of the section >>0). In the section in which the changing rate of the slope is maintained at a relatively small value, the battery charging device may relatively easily process the lithium-plating phenomenon. Therefore, a plurality of charging sections for charging the battery may be determined by the slope of the SOC-OCV graph or the changing rate of the slope, and the borders of respective charging sections when the battery is charged may be distinguished according to the charging time or the charging voltage.

Referring back to FIG. 1, the battery charging device charges the battery for the selected charging section with the charging rate (a first charging rate) corresponding to the selected charging section (the first charging section) (S120). In an exemplary embodiment, the first charging section may be an m-th (m<n) charging section from among n charging sections. Here, the charging rate (also known in the art as C-rate) represents a value for indicating the ratio of the charging current with respect to the capacity of the battery. Accordingly, when the size (or value) of the charging current corresponds to the capacity of the battery, for example, the charging rate is 1 C.

The size of the charging rate corresponding to the respective charging sections is determined to be the maximum size for preventing the lithium plating phenomenon. According to an exemplary embodiment, the sizes of the charging rates corresponding to the respective charging sections are determined by a potential difference (dphisl) between the solid matter and the liquid of the anode and a surface of a separation layer. The potential difference (dphisl) between the solid matter and the liquid satisfies the following Equation 1.

$$dphisl = phis - phil \quad \text{(Equation 1)}$$

In Equation 1, phis denotes a solid potential, that is, an anode potential, and phil denotes a liquid potential, that is, an electrolyte potential. The dphisl is desired to be maintained to be always greater than 0, and it is determined in consideration of a design/manufacturing condition and stability of the battery cell. The dphisl of the battery is provided to be close to zero (0) at an end point of each charging section. When the dphisl of the battery reaches a predetermined dphisl value $U_0$ (e.g., $2 \times 10^{-6}$), the battery charging stage is changed to a next charging section, and the charging rate with a different size is applied to the battery in the next charging section. In such an embodiment, when the first charging section ends, the battery charging device charges the battery with a second charging rate corresponding to a second charging section during a time duration of the second charging section that is the next charging section of the first charging section. In such an embodiment, the charging rate of the next charging section is less than the charging rate of a previous charging section.

Figure 4:
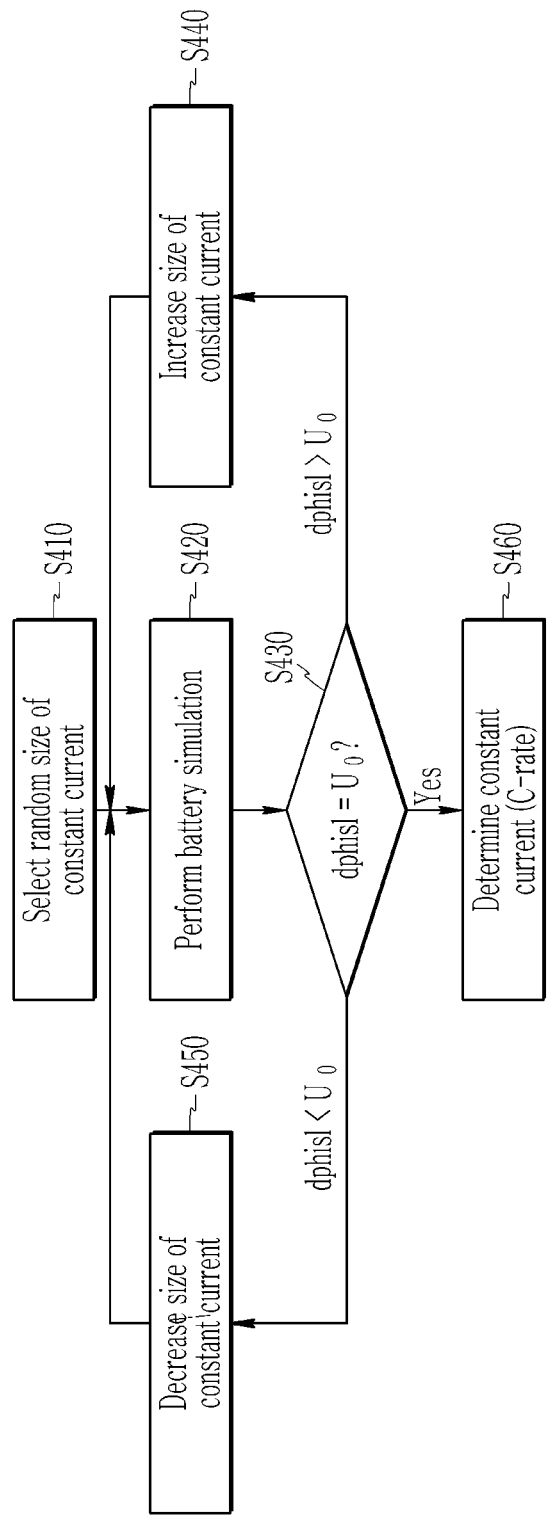
FIG. 4 shows a flowchart of a method for determining charging rates for respective charging sections according to an exemplary embodiment.

FIG. 4 shows a flowchart of a method for determining charging rates for respective charging sections according to an exemplary embodiment.

Referring to FIG. 4, in an exemplary embodiment, the size of the initial charging rate of a specific charging section is randomly selected before a battery charging simulation is performed (S410). In such an embodiment, the size of the initial charging rate may be selected to be greater than 1 C. A battery charging simulation for a specific charging section is performed based on the initial charging rate (S420), and the dphisl on a border of the specific charging section is checked (S430).

When the dphisl of the border of the specific charging section is greater than $U_0$, the size of the charging rate is increased to perform the battery charging simulation (S440) because the fact that the dphisl is greater than $U_0$ means that the battery may endure the high current rate charging. In such an embodiment, when the dphisl of the border of the specific charging section is less than $U_0$, the size of the charging rate is reduced to perform the battery charging simulation (S450) because the fact that the dphisl is less than the $U_0$ means that an excessive charging rate is applied to the battery, which may generate a lithium plating. When the dphisl becomes equal to $U_0$, the size of the charging rate at that time is determined to be the charging rate in the corresponding charging section, and the stages starting from S410 begins to determine the charging rate of the next charging section (S460).

Figure 5:
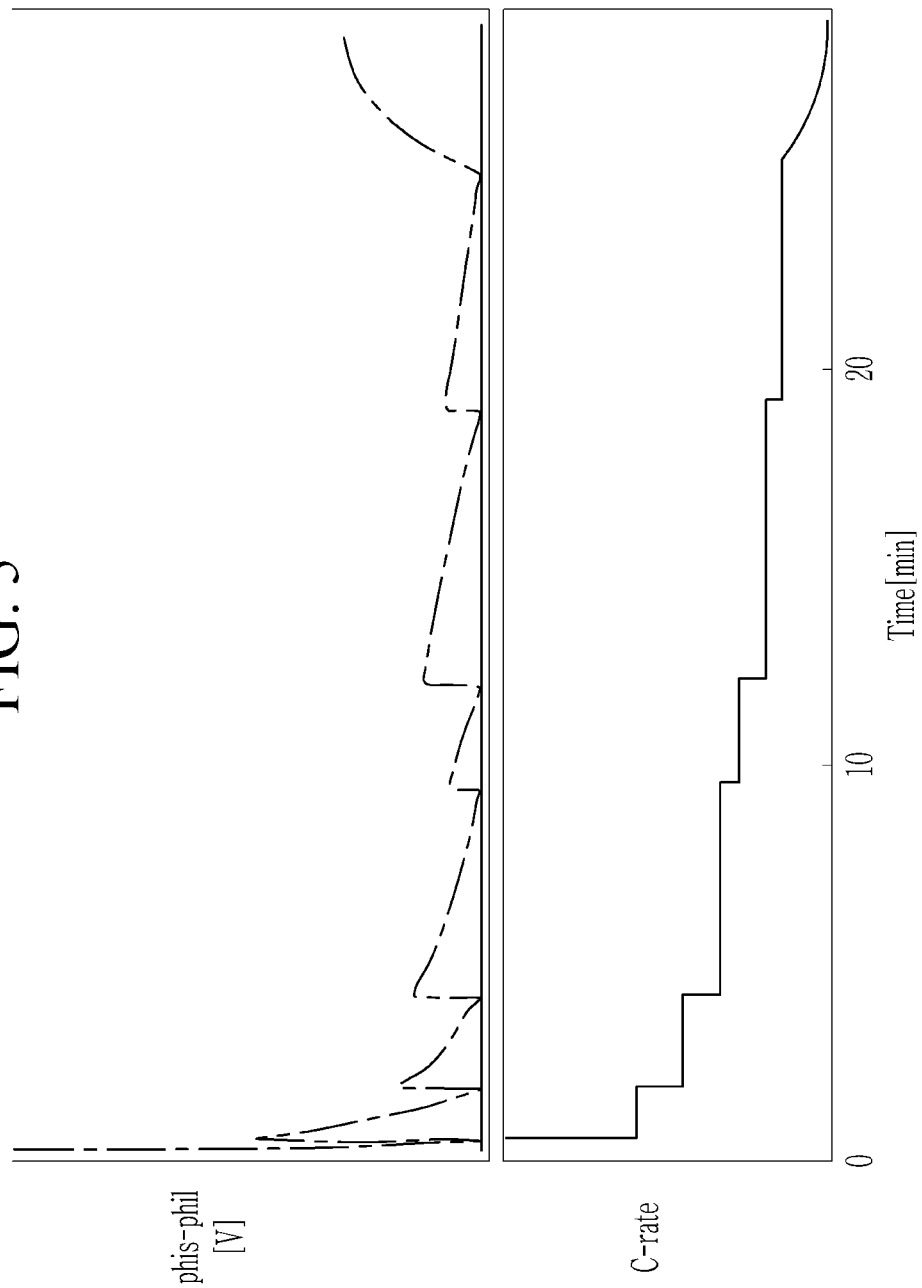
FIG. 5 shows a graph for charging rates and potential difference ("dphisl") for respective charging sections according to an exemplary embodiment.

FIG. 5 shows a graph for charging rates and dphisl for respective charging sections according to an exemplary embodiment.

Referring to FIG. 5, the x-axis represents the time, and the y-axis indicates the charging rate and the size of dphisl. Here, the charging rate represents a relative current size with reference to the current size of discharging the battery for one hour. FIG. 5 shows that the dphisl is quickly reduced in the initial charging section to which a high-level charging rate is applied.

In such an embodiment, the first charging section may be the last n-th charging section (m=n) from among n-numbered charging sections, or the second charging section may be the last charging section. When the current charging section is the last charging section (S130), the battery charging device charges the battery with the n-th charging rate corresponding to the n-th charging section, and monitors the charging voltage of the battery to check if the charging voltage of the battery has reached a predetermined voltage value for the charging section (S140). In such an embodiment, the predetermined voltage value may be expressed with a predetermined ratio (e.g., 99%) for a maximum charging voltage ($V_{max}$), and the predetermined ratio and the maximum charging voltage are determined by considering the cathode, the anode, and the physical property of the electrolyte. In an exemplary embodiment, the battery charging device may adaptively lower the predetermined ratio according to a worn-out degree of the battery or an elapsing time.

When the charging voltage of the battery has reached a predetermined voltage value, the battery charging device may stop applying of a constant current and may apply the maximum charging voltage to the battery (a constant voltage stage) (S150). In such an embodiment, it may be determined whether to enter the constant voltage stage based on design variables of the battery cell and an available maximum range of the SOC. When the constant voltage is applied, the battery charging device may terminate the constant voltage stage with reference to the lowest current value (generally 0.05 C). When the charging of the battery is finished as the constant voltage stage is terminated, the current applied to the battery is intercepted by a current control device. When the constant voltage stage is omitted, the battery charging device may control the size of the n-th charging rate so that the charging voltage may not exceed the maximum charging voltage. That is, the size of the charging rate may be controlled so that the charging voltage of the battery may reach the maximum charging voltage when the desired charging SOC is achieved.

Figure 6:
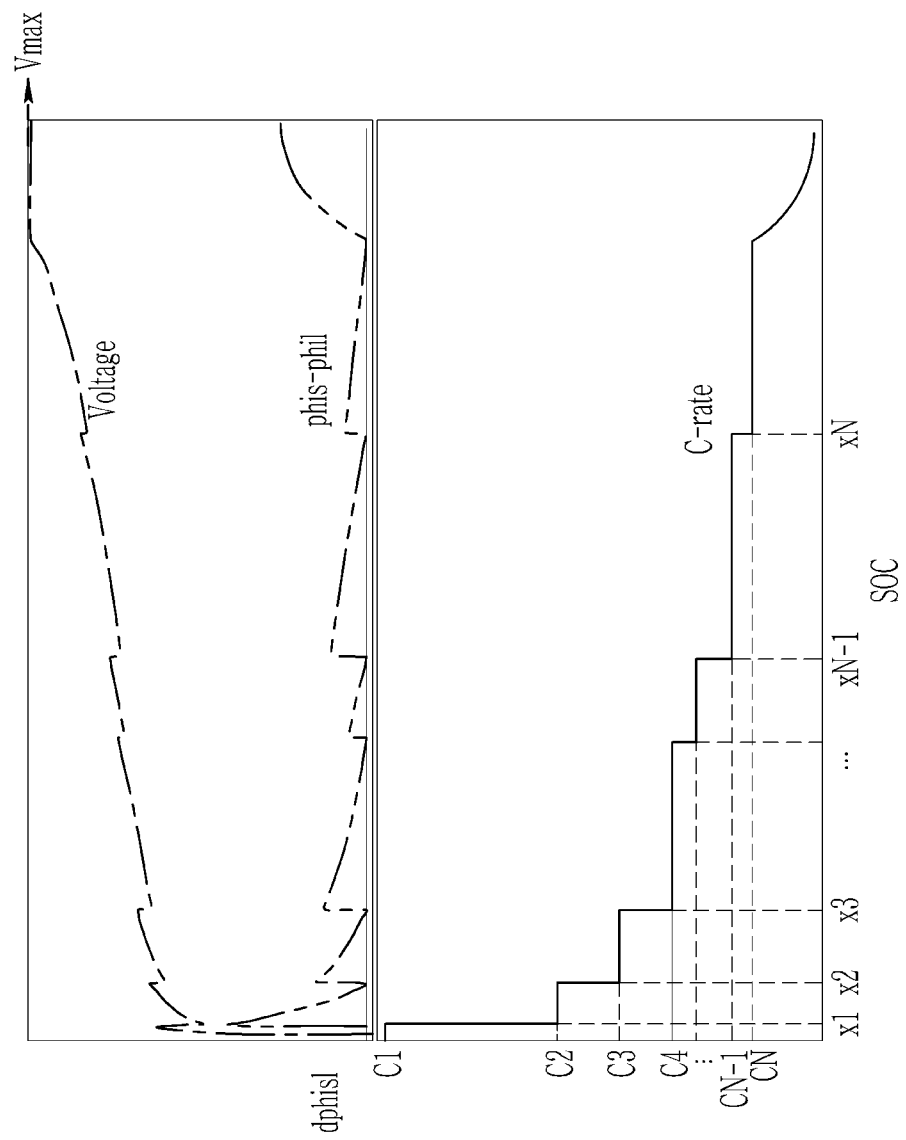
FIG. 6 shows a graph of charging rates applicable at an actual charging time, dphisl, and changes of charging voltages according to an exemplary embodiment.

FIG. 6 shows a graph of charging rates applicable at an actual charging time, dphisl, and changes of charging voltages according to an exemplary embodiment.

Referring to FIG. 6, when the battery is charged with a constant charging rate in each charging section, the dphisl is maintained to be greater than a predetermined value dphisl0 in the entire section, and the charging voltage rapidly increases. The charging section and the charging rate determined according to the above-described method represent values determined according to the characteristic of the anode material, and when the optimized algorithm for the charging section and the charging rate determined by a numerical modeling is applied to the actual battery, a length of the charging section or the size of the charging rate may be controlled in detail to reduce an error caused by a processing deviation of the battery.

Figure 7A:
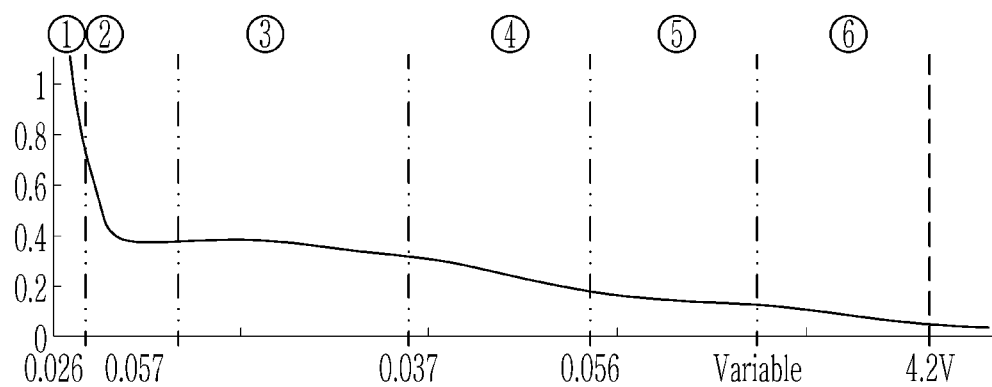
FIGS. 7A and 7B show a graph of a charging section and a charging rate applied to an LCO/Ni—Sn battery cell according to an exemplary embodiment.
Figure 7B:
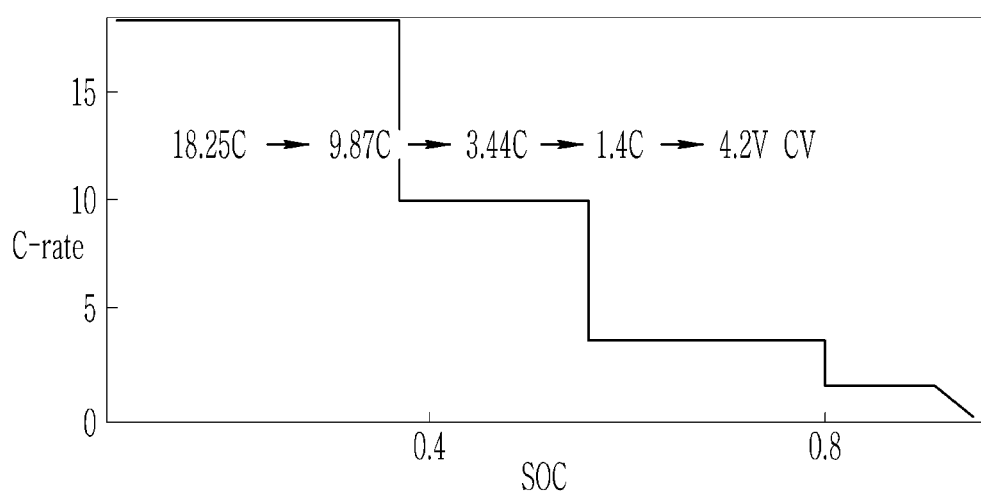
Figure 8:
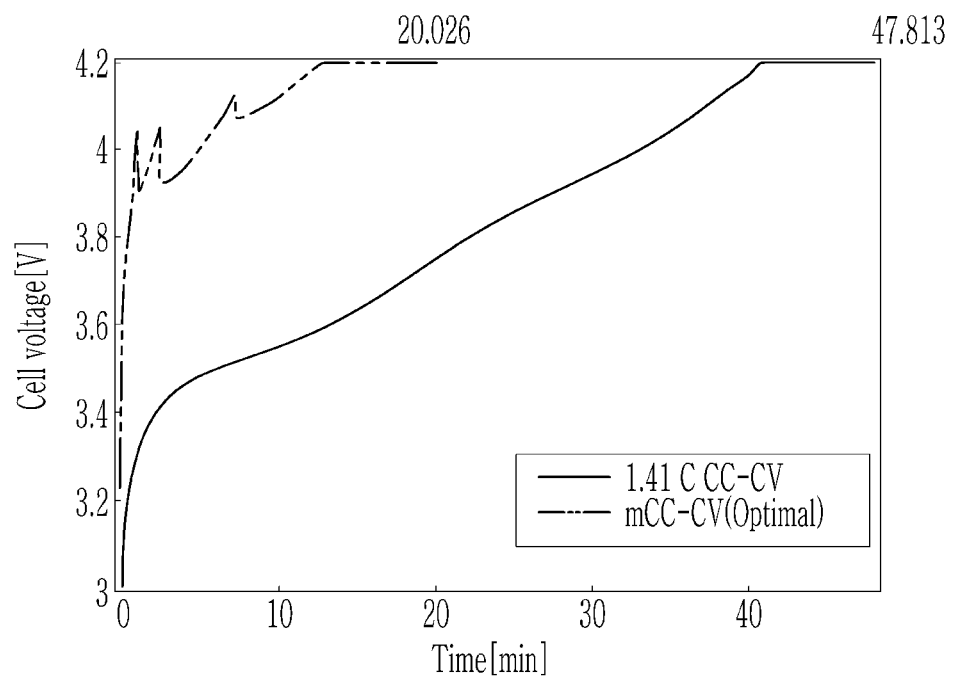
FIG. 8 shows a comparison graph of changes of charging voltages of an LCO/Ni—Sn battery cell according to an exemplary embodiment.
Figure 9:
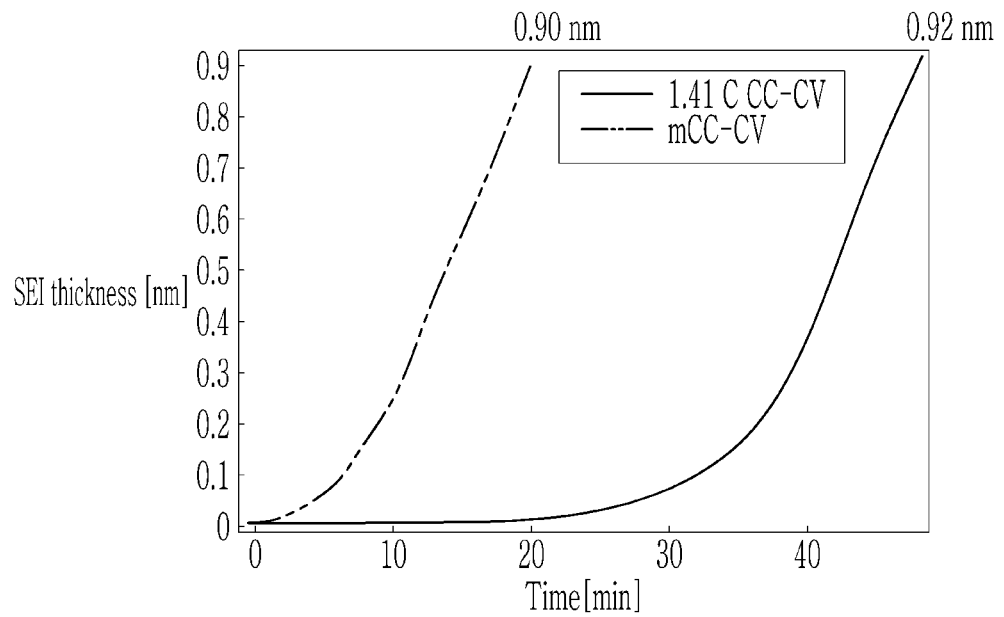
FIG. 9 shows a graph of changes of a thickness of an SEI thin film of an LCO/Ni—Sn battery cell according to an exemplary embodiment.

FIGS. 7A and 7B show graphs of a charging section and a charging rate applied to an LCO/Ni—Sn battery cell according to an exemplary embodiment, FIG. 8 shows a comparison graph of changes of charging voltages of an LCO/Ni—Sn battery cell according to an exemplary embodiment, and FIG. 9 shows a graph of changes of a thickness of an SEI thin film of an LCO/Ni—Sn battery cell according to an exemplary embodiment.

In FIGS. 7A and 7B, the x-axis represents SOC, and the y-axis indicates OCV or size of the charging. In FIG. 8, the x-axis indicates time, and the y-axis denotes charging voltage of the battery cell. In FIG. 9, the x-axis shows time, and the y-axis represents a thickness of a thin film of a solid electrolyte interface (SEI).

Referring to FIGS. 7A and 7B and FIG. 8, the battery cell (capacity of 800 Wh/L for each volume) adopting cathode LCO ($LiCoO_2$)-anode Ni—Sn ($Ni_3Sn_4$) is charged according to an exemplary embodiment of the charging method (mCC-CV). The OCV of the anode is estimated from a result of a low-rate charging (0.1 C of a half cell) experiment using an Ni—Sn anode. Referring to FIG. 7A, six charging sections are determined based on the changing rate of the slope of the anode OCV, and the ending point of the final sixth charging section becomes a point of the constant voltage section. The battery begins being charged in the third charging section by the initial condition (3.0 volts (V), SOC=0,085) of the battery. In an exemplary embodiment, as shown in FIG. 7B, the charging rates of 18.25 C, 9.87 C, 3.44 C and 1.4 C are sequentially applied in the charging sections, and the constant voltage of 4.2 V is finally applied. The finishing condition of the constant voltage section is less than the current of 0.05 C. The dphisl is predetermined to be $2 \times 10^{-6}$ V.

Referring to FIG. 8, battery charging voltages when the voltages are charged in the same battery cell according to the CC-CV scheme are compared. The maximum charging rate within which the lithium plating is not generated in the LCO/Ni—Sn battery cell is 1.41 C which is estimated through a simulation, and the charging voltage when the LCO/Ni—Sn battery cell is charged with this charging rate is shown as a comparison embodiment (1.41 C CC-CV).

Referring to FIG. 8, when the battery charging method according to an exemplary embodiment is applied, the charging time is reduced by equal to or greater than 58% (i.e., 47.8 minutes to 20 minutes) compared to when a charging method according to the conventional constant current charging scheme is applied.

Referring to FIG. 9, the thickness of the SEI thin film (i.e., an SEI increment) that is an index for detecting a degradation of a life-span of the battery cell in an exemplary embodiment is 0.9 nanometer (nm), is substantially similar to the thickness of the SEI thin film of 0.92 nm when the conventional CC-CV charging scheme is applied. Therefore, such an embodiment of the battery charging method is expected to have a similar cycle life-span characteristic to the conventional CC-CV charging scheme.

Figure 10:
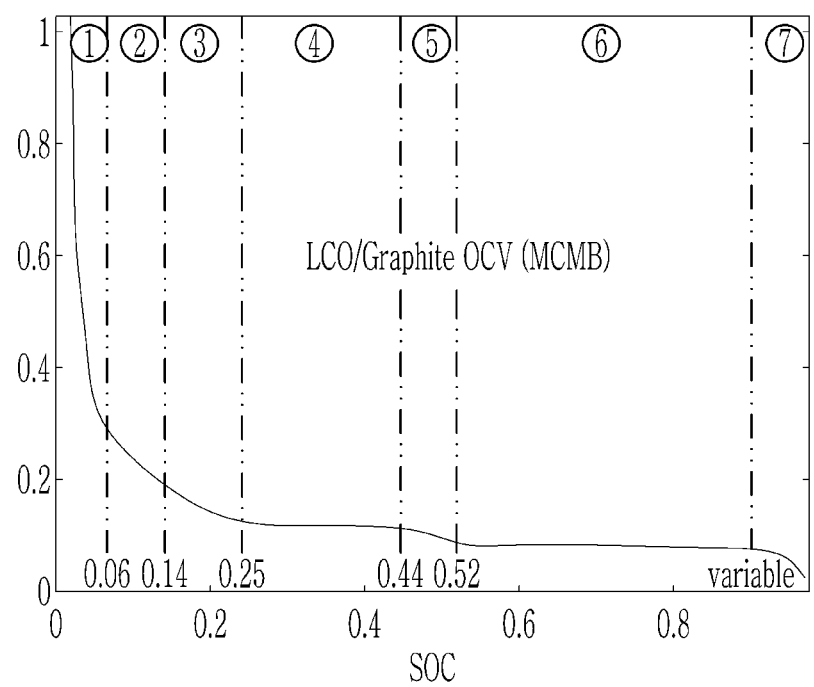
FIG. 10 shows a graph of a charging section applied to an LCO/graphite battery cell according to an exemplary embodiment.
Figure 11:
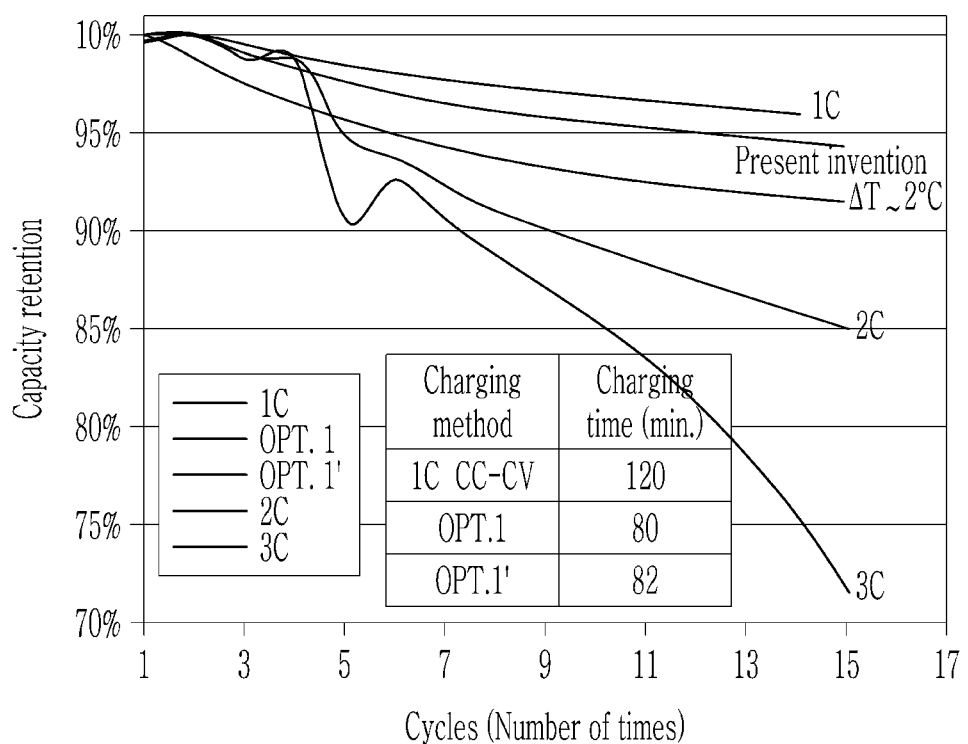
FIG. 11 shows a graph of a comparison result of capacity retention of an LCO/graphite battery cell according to an exemplary embodiment.

FIG. 10 shows a graph of a charging section applied to an LCO/graphite battery cell according to an exemplary embodiment, and FIG. 11 shows a graph of a comparison result of capacity retentions of an LCO/graphite battery cell according to an exemplary embodiment.

Referring to FIG. 10, the charging section determined by the change of the OCV of the battery cell using the graphite that is mesoporous carbon micro beads ("MCMB") as the anode material is shown ($S_0$: 0.45). The CC-CV charging scheme is used to find capacity retention after a charging/discharging cycle of the battery cell is repeated. A charging start voltage 3.0 V and SOC of 0.044 are applied as the initial state of the battery, the charging rates corresponding to the respective charging sections are sequentially 2.47 C, 1.9 C, 1.58 C, 1.24 C, 1.06 C and 0.94 C, and the constant voltage of 4.4 V is applied to the battery in the seventh charging section.

In FIG. 11, the x-axis represents the charging/discharging cycles of the battery cell, and the y-axis indicates capacity retention of the cell measured by an experiment of the battery. Cases to which the charging rates of 1 C, 2 C and 3 C are applied are used as a control group. Referring to FIG. 11, the battery charging method according to an exemplary embodiment has shown improved capacity retention (equal to or greater than 90%) compared to 2 C and 3 C after fourteen cycles are performed. In the case of 1 C, compared to the charging time of 120 minutes, the battery charging method according to an exemplary embodiment (OPT.1 or OPT.1') has the charging time of 80 minutes, thereby showing the 33.3% of improvement than 1 C from the viewpoint of the charging time.

Figure 12A:
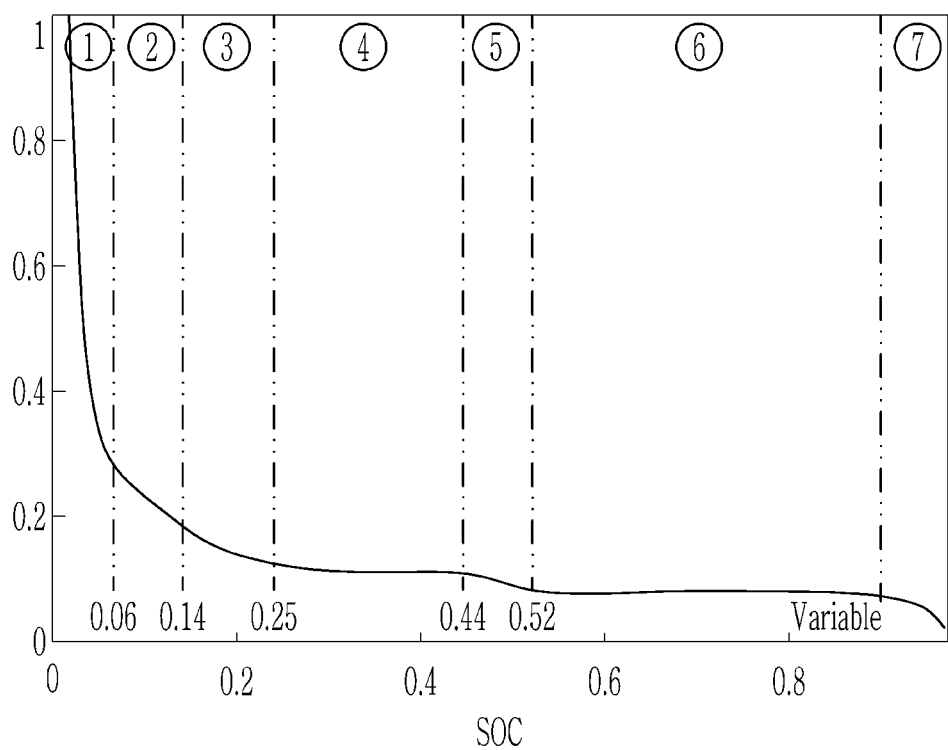
FIG. 12A to FIG. 12C show graphs of changes of dphisl with respect to charging section, charging rate, and time of an LCO/graphite battery cell according to an exemplary embodiment.
Figure 12B:
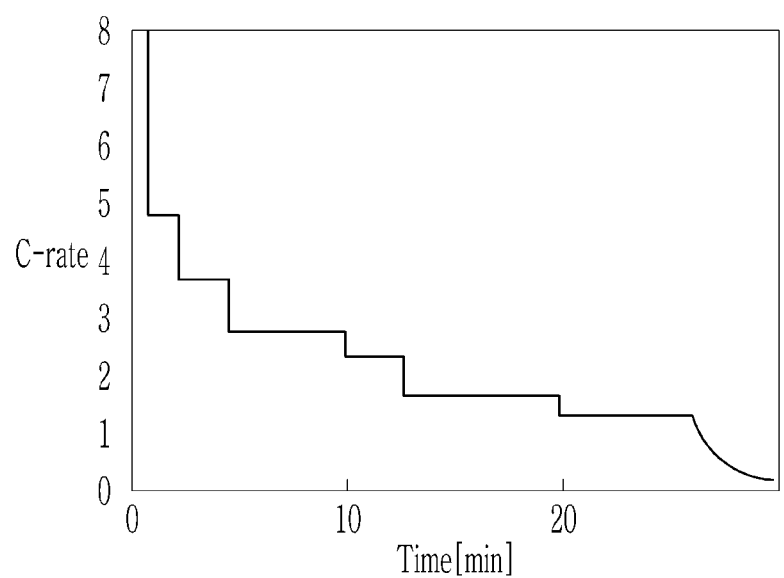
Figure 12C:
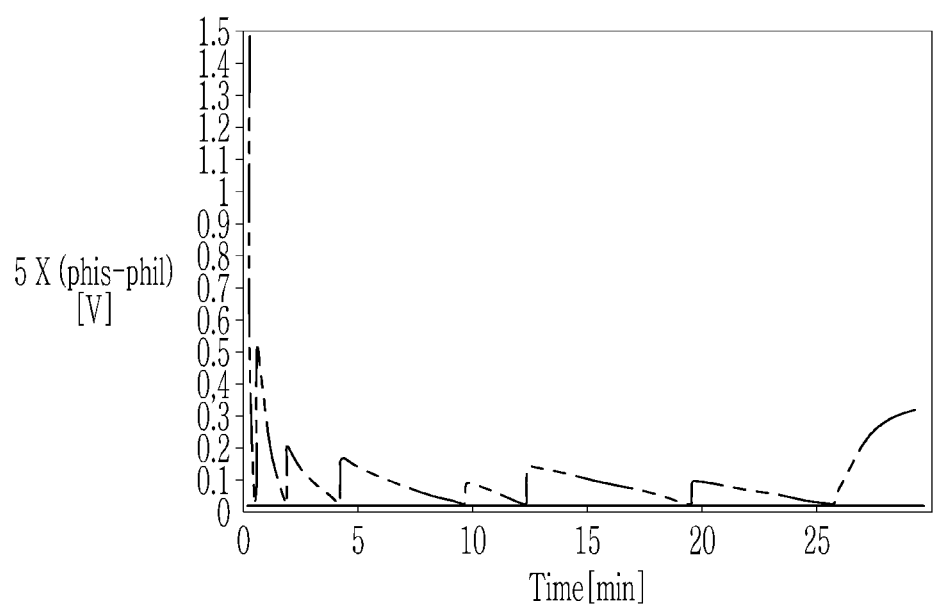
Figure 13:
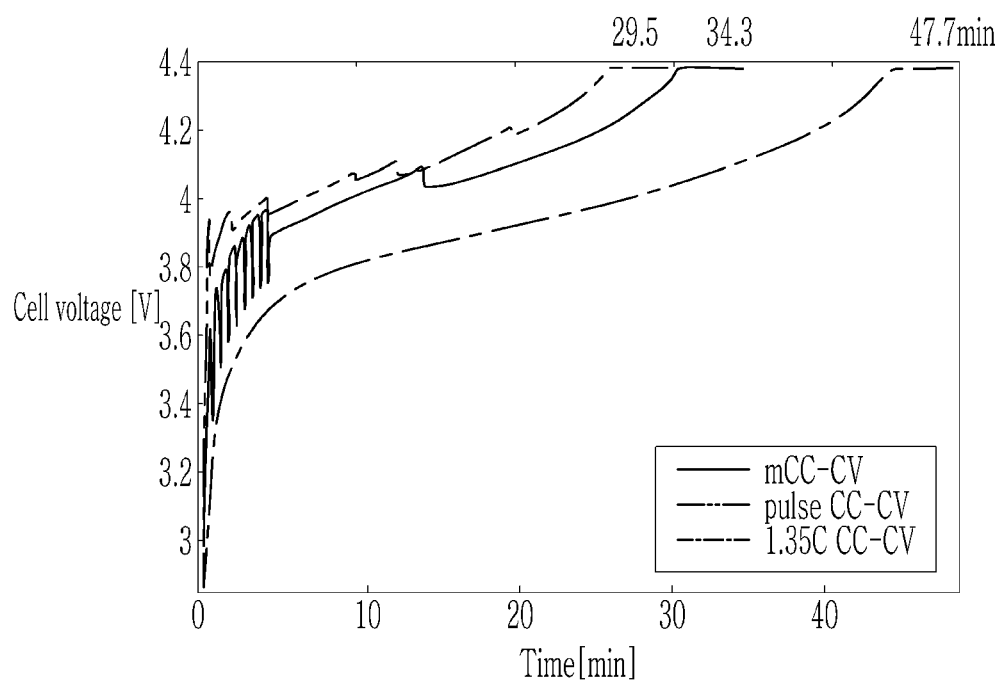
FIG. 13 shows a graph of comparison of changes of a charging voltage of an LCO/graphite battery cell according to an exemplary embodiment.
Figure 14:
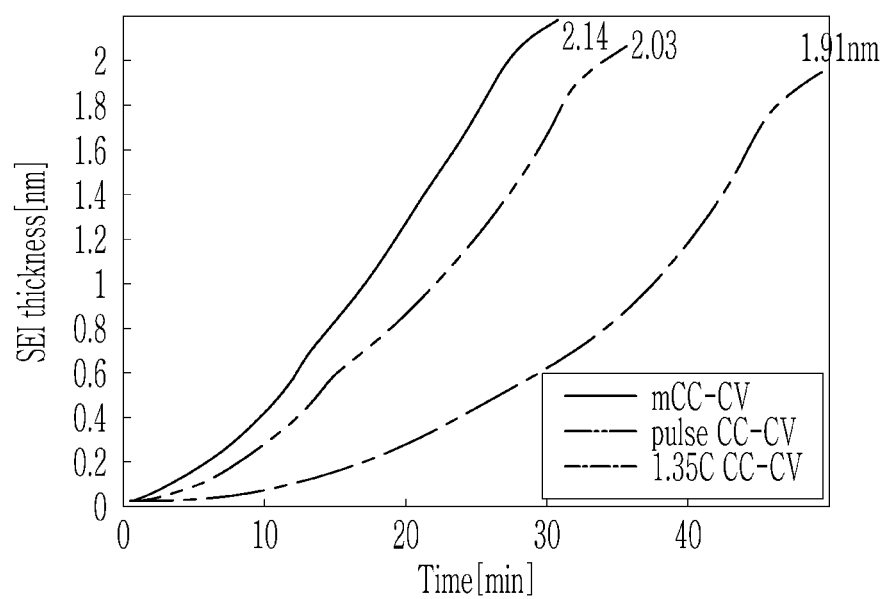
FIG. 14 shows a graph of changes of a thickness of an SEI thin film of an LCO/graphite battery cell according to an exemplary embodiment.

FIG. 12A to FIG. 12C show graphs of changes of dphisl with respect to charging section, charging rate, and time of an LCO/graphite battery cell according to an exemplary embodiment, FIG. 13 shows a graph of comparison of changes of a charging voltage of an LCO/graphite battery cell according to an exemplary embodiment, and FIG. 14 shows a graph of changes of a thickness of an SEI thin film of an LCO/graphite battery cell according to an exemplary embodiment.

In FIG. 12A, the x-axis is SOC, and the y-axis shows the size of OCV. In FIG. 12B and FIG. 12C, the x-axis represent time, and the y-axis indicates the charging rate and the size of dphisl. In FIG. 13, the x-axis is time, and the y-axis is the charging voltage of a battery cell. In FIG. 14, the x-axis indicates time, and the y-axis is the thickness of an SEI thin film.

Referring to FIG. 12A to FIG. 12C, FIG. 13, and FIG. 14, the battery cell (capacity of 800 Wh/L for each volume) adopting cathode LCO ($LiCoO_2$)-anode graphite is charged according to an exemplary embodiment of the charging method. Referring to FIG. 12A, six charging sections are determined ($S_0$: 0.6) based on the changing rate of the slope of the anode OCV, and the ending point of the final or sixth charging section becomes a point of the constant voltage section. The battery begins being charged in the second charging section by the initial condition (3.0 V, SOC=0,035) of the battery. The charging rates sequentially are 8.25 C, 4.92 C, 3.73 C, 2.75 C, 2.335 C, 1.63 C and 1.25 C in the respective charging sections, and the constant voltage of 4.4 V is finally applied. The dphisl is predetermined to be $2 \times 10^{-6}$ V.

Referring to FIG. 13, battery charging voltages when the voltages are charged in the same battery cell according to the CC-CV scheme, and the battery charging voltage according to a pulse charging scheme are compared. The maximum charging rate, within which the lithium plating does not occur, in the LCO/graphite battery cell is 1.35 C which is estimated or determined through a simulation, and the charging voltage when the LCO/graphite battery cell is charged with the charging rate of 1.35 C is shown as a comparison embodiment. The pulse charging scheme represents the result of local optimization determined by performing the numerical experiment more than 20 times.

Referring to FIG. 13, when the battery charging method according to an exemplary embodiment is applied, the charging time is reduced by equal to or greater than 38% (reduced form 47.7 minutes to 29.5 minutes) compared to the conventional constant current charging scheme, and the charging time is reduced by about 14% (reduced from 34.3 minutes to 29.5 minutes) compared to the pulse charging scheme.

Referring to FIG. 14, the thickness of the SEI thin film is 2.14 nm, which is similar to the thickness of 1.91 nm in a case of the conventional CC-CV charging scheme is used and the thickness of 2.03 nm in a case of the pulse charging scheme. Therefore, such an embodiment is expected to have a similar cycle life-span characteristic to the conventional CC-CV charging scheme and the pulse charging scheme.

Figure 15:
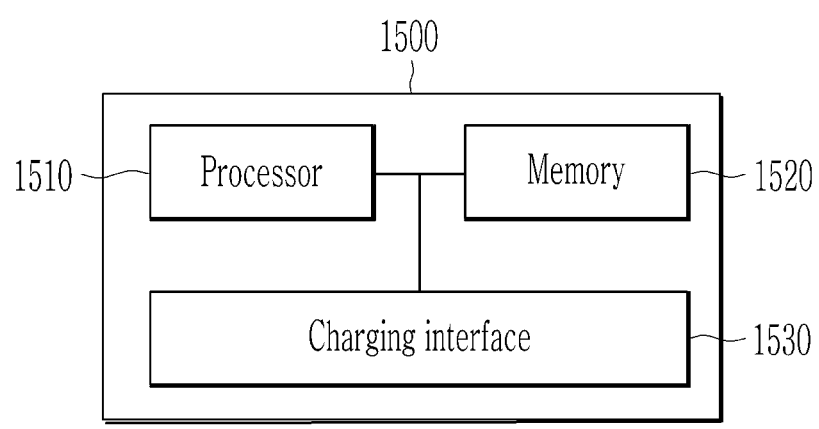
FIG. 15 shows a block diagram of a battery charging device according to an exemplary embodiment.

FIG. 15 shows a block diagram of a battery charging device according to an exemplary embodiment.

Referring to FIG. 15, an exemplary embodiment of the battery charging device 1500 includes a processor 1510, a memory 1520, and a charging interface 1530.

The memory 1520 may be connected to the processor 1510 to store various kinds of information for driving the processor 1510 or at least one program to be performed by the processor 1510. The processor 1510 may realize functions, processes, or methods proposed in the exemplary embodiments of the disclosure. That is, an operation of the battery charging device 1500 according to an exemplary embodiment of the battery charging method may be realized by the processor 1510. The charging interface 1530 may be connected to the battery in a wired or wireless manner to monitor the charging amount (a SOC or a charging voltage) of the battery according to control by the processor 1510 and apply the current and the voltage for charging the battery to the battery.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for charging a battery, the method comprising:
monitoring a state of the battery;
determining, based on the monitored state of the battery, a current charging stage among a plurality of charging stages to which a multi-stage constant current charging scheme is applied, wherein the plurality of charges stages is consecutive stages in which the battery is charged with different constant charging rates, respectively; and
charging the battery during the current charging stage with a current charging rate corresponding to the current charging stage,
wherein the current charging rate corresponding to the current charging stage is determined to maintain a potential difference between a potential of an anode of the battery and a potential of an electrolyte solution of the battery to be greater than zero in the current charging stage.

2. The method of claim 1, further comprising:
charging the battery during a next charging stage with a next charging rate corresponding to the next charging stage when the current charging stage ends,
wherein the next charging rate is less than the current charging rate.

3. The method of claim 2, wherein the current charging stage ends when the potential difference is determined to be equal to or less than a predetermined value.

4. The method of claim 3, wherein the predetermined value is $2 \times 10^{-6}$ volt.

5. The method of claim 1, further comprising:
determining the current charging stage of the battery is a last charging stage among the plurality of charging stages by monitoring whether a charging voltage of the battery has reached a predetermined voltage value; and
applying a predetermined constant charging voltage to the battery when the charging voltage is determined to be equal to the predetermined voltage value.

6. The method of claim 1, wherein
the plurality of charging stages is determined based on a window with a predetermined height applied with reference to a minimum or a maximum of a differential graph of a functional relation of an open circuit voltage of an anode material of the battery with respect to a state of charge, and
the predetermined height is predetermined according to complexity of a charging processor.

7. The method of claim 6, wherein
as the predetermined height increases, a width of the window increases to increase respective lengths of the plurality of charging stages, and
as the predetermined height decreases, the width of the window reduces to reduce the respective lengths of the plurality of charging stages.

8. The method of claim 6, wherein
as the predetermined height increases, a width of the window increases to reduce a number of the plurality of charging stages, and
as the predetermined height increases, the width of the window reduces to increase the number of the plurality of charging stages.

9. A device for charging a battery comprising:
a processor;
a memory connected to the processor; and
a charging interface connected to the battery,
wherein the processor performs a program stored in the memory to perform:
monitoring a state of the battery;
determining, based on the monitored state of the battery, a first charging stage among a plurality of charging stages to which a multi-stage constant current charging scheme is applied, wherein the plurality of charges stages is consecutive stages in which the battery is charged with different constant charging rates, respectively; and
charging the battery during the first charging stage with a first charging rate corresponding to the first charging stage,
wherein the first charging rate corresponding to the first charging stage is determined to maintain a potential difference between a potential of an anode of the battery and a potential of an electrolyte solution of the battery to be greater than zero in the first charging stage.

10. The device of claim 9, wherein
the processor performs the program stored in the memory to further perform:
charging the battery during a second charging stage with a second charging rate corresponding to the second charging stage when the first charging stage ends,
wherein the second charging rate is less than the first charging rate.

11. The device of claim 10, wherein the second charging stage starts when the potential difference in the first charging stage is determined to be equal to or less than a predetermined value.

12. The device of claim 11, wherein the predetermined value is $2 \times 10^{-6}$ volt.

13. The device of claim 9, wherein
the processor performs the program stored in the memory to further perform:

monitoring whether a charging voltage of the battery has reached a predetermined voltage value when a current charging stage of the battery is a last charging stage among the plurality of charging stages; and applying a predetermined constant charging voltage to the battery when the charging voltage is determined to be equal to the predetermined voltage value.

14. The device of claim 9, wherein the plurality of charging stages are determined based on a window with a predetermined height applied with reference to a minimum or a maximum of a differential graph of a functional relation of an open circuit voltage of an anode material of the battery with respect to a state of charge, and the predetermined height is predetermined according to complexity of a charging processor.

15. The device of claim 14, wherein as the predetermined height increases, a width of the window increases to increase respective lengths of the plurality of charging stages, and as the predetermined height decreases, the width of the window reduces to reduce the respective lengths of the plurality of charging stages.

16. The device of claim 14, wherein as the predetermined height increases, a width of the window increases to reduce a number of the plurality of charging stages, and as the predetermined height decreases, the width of the window reduces to increase the number of the plurality of charging stages.

* * * * *